United States Patent [19]

Heinecke et al.

[11] Patent Number: 4,460,618
[45] Date of Patent: Jul. 17, 1984

[54] ALUMINUM DEPOSITION ON SEMICONDUCTOR BODIES

[75] Inventors: Rudolf A. H. Heinecke, Harlow; Ronald C. Stern, Cheshunt, both of England

[73] Assignee: ITT Industries, Inc., New York, N.Y.

[21] Appl. No.: 314,944

[22] Filed: Oct. 26, 1981

Related U.S. Application Data

[63] Continuation of Ser. No. 168,848, Jul. 10, 1980, abandoned, which is a continuation of Ser. No. 34,068, Apr. 27, 1979, abandoned.

[30] Foreign Application Priority Data

May 25, 1978 [GB] United Kingdom ............... 22632/78

[51] Int. Cl.³ ........................ B05D 3/06; C23C 11/00
[52] U.S. Cl. ..................................... 427/39; 156/643; 156/646; 427/88; 427/91; 427/252; 427/255; 427/299
[58] Field of Search ............... 427/88, 39, 91, 99, 427/229, 34, 252, 250, 255, 299, 255.1, 404, 343; 156/643, 646

[56] References Cited

U.S. PATENT DOCUMENTS

| | | |
|---|---|---|
| 2,867,546 | 1/1959 | MacNevin .......................... 427/252 |
| 2,929,739 | 3/1960 | Breining et al. .................... 427/252 |
| 2,990,295 | 6/1961 | Breining et al. .................... 427/252 |
| 3,041,197 | 6/1962 | Berger ................................ 427/229 |
| 3,158,499 | 11/1964 | Jenkin ................................ 427/229 |
| 3,188,230 | 6/1965 | Bakish et al. ...................... 427/252 |
| 3,282,243 | 11/1966 | Phillips et al. ..................... 427/252 |
| 3,402,067 | 9/1968 | Langley ............................. 427/229 |
| 3,615,956 | 10/1971 | Irving et al. ....................... 156/646 |
| 3,994,793 | 11/1976 | Harvilchuck et al. ............. 156/646 |
| 4,031,274 | 6/1977 | Bessen .............................. 427/229 |
| 4,148,965 | 4/1979 | Jelli .................................. 427/299 |

FOREIGN PATENT DOCUMENTS

| | | | |
|---|---|---|---|
| 758258 | 1/1969 | Belgium ............................. 427/229 |
| 1235106 | 2/1967 | Fed. Rep. of Germany ...... 427/252 |
| 1267054 | 4/1968 | Fed. Rep. of Germany ...... 427/252 |
| 2309506 | 8/1974 | Fed. Rep. of Germany ........ 427/91 |
| 49-11540 | 3/1974 | Japan ................................ 427/252 |
| 49-11541 | 3/1974 | Japan ................................ 427/229 |
| 1352619 | 5/1974 | United Kingdom ............... 427/252 |

OTHER PUBLICATIONS

Pierson, "Aluminum Coatings by the Decomposition of Alkyls", p. 257, Apr. 8, 1977.
Hiler et al., "Development of a Method to Accomplish Aluminum Deposition by Gas Plating,"0 WADC Tech. Report, pp. 13, 20, 24 & 25, Jun. 1959.
Powell, "Chemically Deposited Metals" *Vapor Deposition*, edited by Powell et al., pp. 277-283, 1966.

*Primary Examiner*—Sadie L. Childs
*Attorney, Agent, or Firm*—James B. Raden

[57] ABSTRACT

Aluminum conductor tracks are formed e.g. on a semiconductor body by vapor depositing a layer of aluminum from tri-isobutyl aluminum and then selectively etching the routing. The surface of the semiconductor body is activated in a hydrogen discharge in the presence of a transport metal.

9 Claims, 1 Drawing Figure

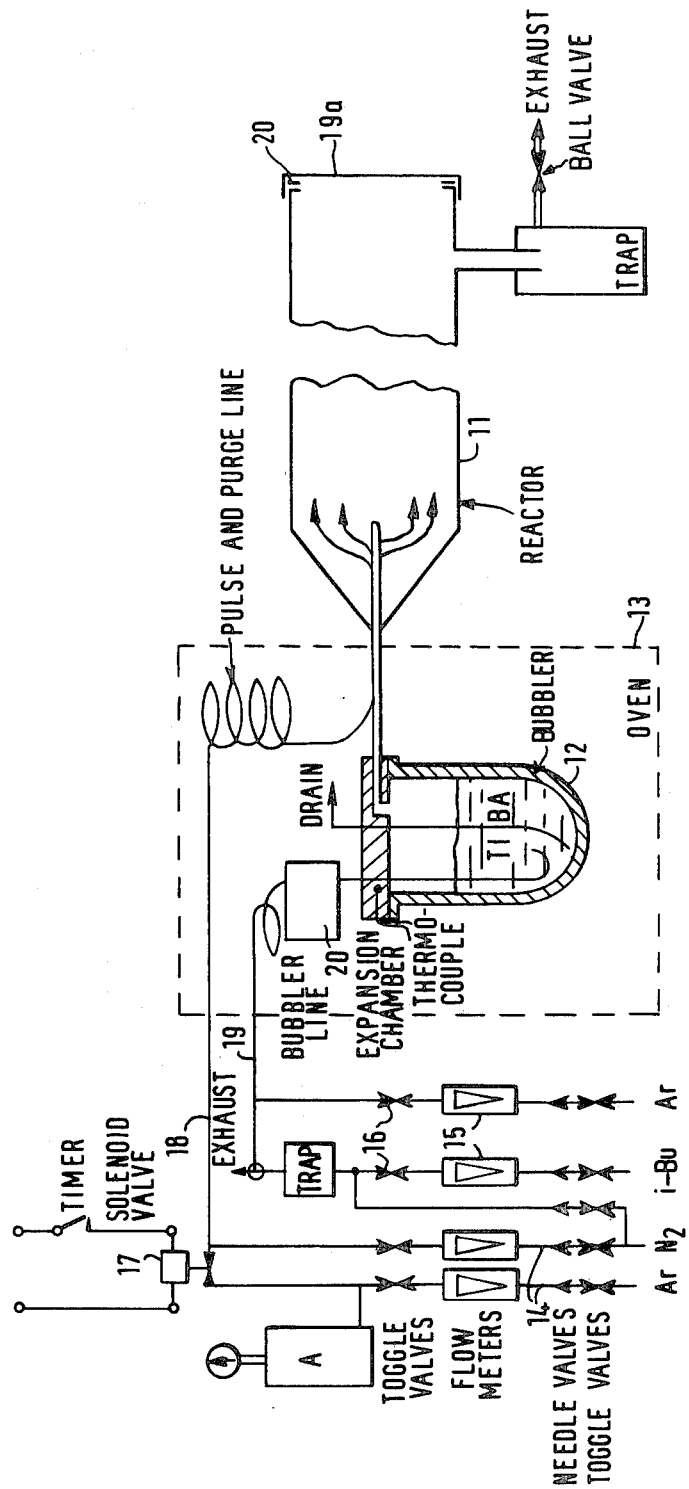

ALUMINUM DEPOSITION ON SEMICONDUCTOR BODIES

This is a continuation of application Ser. No. 168,848, filed July 10, 1980 which is a continuation of application Ser. No. 034,068 filed Apr. 27, 1979, both now abandoned.

BACKGROUND OF THE INVENTION

This invention relates to the vapor deposition of metal film and in particular to the thermally induced deposition of aluminum from volatile aluminum compounds for the provision of conductive tracks on semiconductor devices.

Generally conductive tracks on semiconductor devices are provided by vacuum evaporation of a metal, typically aluminum. This process, however, requires very careful control to ensure that a hard vacuum is maintained and that traces of impurities are excluded. Furthermore, vacuum processing requires the provision of relatively expensive airlocks and involves considerable process time. Also it has proved difficult to provide vacuum evaporated metal films which follow surface irregularities, e.g. cracks or steps, without discontinuity. The object of the invention is to minimize or to overcome these disadvantages.

Our U.S. patent application Ser. No. 034,067, filed Apr. 27, 1979, now abandoned describes a process for the pyrolytic deposition of aluminum from tri-isobutyl aluminum (TIBA) the process including passing a stream of dry, oxygen free inert gas such as argon or nitrogen, through a quantity of liquid TIBA maintained at a temperature below 90° C., so as to entrain a proportion of TIBA vapor, feeding the argon and entrained TIBA to a reaction chamber containing workpieces to be coated in the aluminum, selectively pulsing dry, oxygen free, argon or nitrogen into the reaction chamber so as to provide a substantially uniform TIBA concentration within the vessel, and maintaining the workpieces at a temperature in the range 250°–270° C. thereby causing pyrolytic deposition of aluminum thereon.

SUMMARY OF THE INVENTION

According to this invention there is provided a process for providing aluminum tracks on a semiconductor body, the process including, activating the surface of the body in a hydrogen discharge, depositing aluminum on the activated surface by thermal decomposition of tri-isobutyl aluminum (TIBA) supplied in vapor form to a reaction chamber maintained at a temperature in the range 250°–270° C., and selective etching of the aluminum to define the conductive tracks, and in which the TIBA, prior to entry into the reaction chamber, is maintained at a temperature below 90°.

Tri-isobutyl aluminum (TIBA) is known to split at a temperature of around 100° C. into isobutylene and di-isobutyl aluminum hydride, a compound with a relatively low vapor pressure. It is thought that the problems involved in such a thermal deposition process, i.e. poor quality films and poor reproducibility, are caused by condensation of di-isobutyl aluminum hydride on the inner surfaces and the vapor feed lines of the deposition apparatus. In time this condensate reacts with traces of impurity gases, e.g. water and oxygen. Even though such a layer may be very thin it is thought that its catalytic activity changes part of the TIBA vapors on their way to the deposition reactor resulting in the previously observed inferior film quality.

BRIEF DESCRIPTION OF THE DRAWING

An embodiment of the invention will now be described with reference to the accompanying drawing which is a schematic view of an apparatus for the thermal deposition of aluminum on semiconductor devices.

DETAILED DESCRIPTION OF THE INVENTION

Referring to the drawing, the apparatus includes a reaction vessel 11 in which pyrolytic deposition of aluminum is effected and which is maintained at a temperature in the range 250°–270° C. by a furnace (not shown). Tri-isobutyl aluminum vapor is carried into the reaction vessel 11 in a steady stream of dry, oxygen free, argon or nitrogen which is fed through a bubbler 12 containing liquid TIBA and which is maintained at a temperature of 80°–90° C. by an oven 13.

Supplies of gases to the apparatus are provided via inlet control valves 14, flowmeters 15 and valves 16. A solenoid operable change-over valve 17 couples selectively via a tube 18 to the reactor 11. Pipe 19 supplies argon to the bubbler 12 via an expansion chamber 20. In order to reduce the rate of conversion of TIBA into DIBAH, which is probably catalyzed by the surfaces of the vapor feed lines of the apparatus, it is necessary to maintain the TIBA vapor temperature below 90° C. and preferably within the range 84° to 86° C. The amount of TIBA fed into the reaction vessel 11 is determined both by the temperature and the flow rate of argon through the bubbler. In the arrangement described in argon flow rate of 7 liters/min at a TIBA temperature of 85° C. was found to be suitable.

Pyrolytic deposition of aluminum onto semiconductor process wafers 23 is effected in the reaction vessel 11 which vessel is maintained at a temperature preferably between 250°–270° C. We have found that at temperatures below 250° C. little deposition takes place, while at temperatures above 270° C. the film quality becomes poor.

While not in operation the apparatus is purged with purified nitrogen fed via the tube 18 to the reaction vessel 11. Furthermore, through all periods when the reactor 11 is cold or at a reduced temperature, isobutylene is passed through the bubbler at a rate of about one bubble per second in order to convert any DIBAH contamination in the gas lines back into TIBA.

We have found that this technique of purging the apparatus with isobutylene results in superior quality deposited films. It should be noted that when the apparatus is in use the isobutylene purge is turned off.

Silicon wafers to be aluminum coated are prepared by pretreatment of the wafers in a hydrogen glow discharge in the presence of certain metals such as gold or nickel. It is observed that the wafer surface is activated by transport of the metal via the plasma. The thus activated surfaces of the wafers are then ready for aluminum deposition. The activated surface is stable, and the wafer may if necessary be left in air for several days with little degradation.

For deposition the wafers 23 are loaded through a door 19a at one end of the reactor 11. The door is closed against gasket 20 and the reactor 11 is purged with nitrogen. After the wafers have had sufficient time to reach the temperature of the reactor the nitrogen purge is switched off and argon is supplied to the bubbler so as to introduce TIBA to the reactor 11. Uniform distribution of the gas within the reaction is ensured by supplying periodic pulses of dry, oxygen free argon or nitrogen via the tube 18 and solenoid valve. The valve may be controlled advantageously by a timer 21, a suitable pulse rate being 1 second on in every 20 seconds. Typical operation conditions are as follows:

Oven temperature 85° C.
Reactor temperature 250°–270° C.
Argon flow rate 7 liters/minute
Argon pulse rate 1 second in 20 seconds.

This results in a deposition rate of the order of 0.1 microns/minute.

The deposition process is terminated by switching off the carrier gas and purging the reactor with purified nitrogen for a further two minutes. The aluminum coated wafers are then masked and etched, e.g. by a plasma etching process, to selectively remove portions of the aluminum so as to define the required conductor tracks.

We claim:

1. A process for the pyrolytic deposition of aluminum from tri-isobutyl aluminum (TIBA) on a hydrogen plasma activated surface of a semiconductor body, comprising the steps of:
   a. activating the surface of a semiconductor body in a hydrogen glow discharge in the presence of a transport metal; and
   b. pyrolytically depositing aluminum on said activated surface of said semiconductor body, said depositing step comprising:
      (i) bubbling a stream of dry, oxygen-free inert gas through a quantity of liquid TIBA so as to entrain a portion of TIBA vapor;
      (ii) maintaining the liquid TIBA and inert gas at a temperature between 80° and 90° C.;
      (iii) feeding the inert gas and entrained TIBA to a reaction chamber in which said activated surfaced semiconductor body is disposed;
      (iv) maintaining a temperature in said reaction chamber within the range between 250° to 270° C. to cause the pyrolytic deposition of aluminum onto said activated surface of said semiconductor body; and
      (v) supplying periodic pulses of dry, oxygen free inert gas without entrained TIBA to the reaction chamber during deposition whereby a substantially uniform TIBA concentration is maintained within said chamber.

2. The process as claimed in claim 1, and which includes purging the reaction chamber with iso-butylene prior to and after aluminum deposition.

3. The process as claimed in claim 1 or 2 wherein the inert gas is selected from the group consisting of argon and nitrogen.

4. The process according to claim 1, wherein said transport metal is selected from the group consisting of nickel and gold.

5. The process according to claim 2, wherein the step of purging with isobutylene is at a rate of one bubble per second to convert any di-isobutyl aluminum hydride into TIBA.

6. The process according to claim 1, wherein the inert gas is bubbled through the liquid TIBA at a rate of 7 liters per minute.

7. The process according to claim 1, wherein the inert gas without entrained TIBA is pulsed into the reaction chamber at a pulse rate of one second on for a twenty-second period.

8. The process according to claim 1, wherein the aluminum is deposited at a rate of approximately 0.1 microns per minute.

9. A process according to claim 1, additionally comprising the step of selectively etching the deposited aluminum so as to define conductive tracks.

* * * * *